(12) United States Patent
Dunn et al.

(10) Patent No.: US 8,764,999 B2
(45) Date of Patent: Jul. 1, 2014

(54) SIDEWALL IMAGE TRANSFER PITCH DOUBLING AND INLINE CRITICAL DIMENSION SLIMMING

(75) Inventors: Shannon W. Dunn, Altamont, NY (US); Dave Hetzer, Schenectady, NY (US)

(73) Assignee: Tokyo Electron Limited, Tokyo (JP)

(*) Notice: Subject to any disclaimer, the term of this patent is extended or adjusted under 35 U.S.C. 154(b) by 150 days.

(21) Appl. No.: 13/158,899

(22) Filed: Jun. 13, 2011

(65) Prior Publication Data

US 2012/0128935 A1 May 24, 2012

Related U.S. Application Data

(60) Provisional application No. 61/416,496, filed on Nov. 23, 2010.

(51) Int. Cl.
| | |
|---|---|
| B44C 1/22 | (2006.01) |
| H01L 21/302 | (2006.01) |
| G03F 7/40 | (2006.01) |
| G03F 7/00 | (2006.01) |
| H01L 21/027 | (2006.01) |
| H01L 21/033 | (2006.01) |

(52) U.S. Cl.
CPC ............ *H01L 21/0337* (2013.01); *G03F 7/405* (2013.01); *G03F 7/0035* (2013.01); *G03F 7/40* (2013.01); *H01L 21/0274* (2013.01); *Y10S 438/947* (2013.01); *Y10S 438/948* (2013.01)
USPC ................. 216/41; 216/58; 216/83; 438/689; 438/947; 438/948; 430/311; 430/314; 430/324; 430/325

(58) Field of Classification Search
CPC ........................... B82Y 10/00; H01L 21/0337
USPC ................ 216/41, 58, 83; 438/689, 947, 948; 430/311, 315, 324, 325
See application file for complete search history.

(56) References Cited

U.S. PATENT DOCUMENTS

| | | | | |
|---|---|---|---|---|
| 7,419,771 | B2* | 9/2008 | Ho et al. ...................... | 430/322 |
| 8,227,176 | B2* | 7/2012 | Lee .............................. | 430/315 |
| 8,426,117 | B2* | 4/2013 | Hasebe et al. ............... | 430/314 |
| 8,455,183 | B2* | 6/2013 | Tsuruda et al. .............. | 430/325 |
| 8,492,282 | B2* | 7/2013 | DeVilliers ................... | 438/703 |
| 2008/0076070 | A1* | 3/2008 | Koh et al. .................... | 430/311 |
| 2009/0087991 | A1* | 4/2009 | Yatsuda et al. .............. | 438/694 |

(Continued)

FOREIGN PATENT DOCUMENTS

WO 2008027239 A2 3/2008

OTHER PUBLICATIONS

European Patent Office, International Search Report and Written Opinion issued in corresponding application PCT/US2011/060381 mailed Aug. 14, 2012, 9 pp.

(Continued)

*Primary Examiner* — Shamim Ahmed
(74) *Attorney, Agent, or Firm* — Wood, Herron & Evans, LLP

(57) ABSTRACT

A method for patterning a substrate is described. The patterning method may include performing a lithographic process to produce a pattern and a critical dimension (CD) slimming process to reduce a CD in the pattern to a reduced CD. Thereafter, the pattern is doubled to produce a double pattern using a sidewall image transfer technique.

23 Claims, 9 Drawing Sheets

(56) References Cited

U.S. PATENT DOCUMENTS

| | | |
|---|---|---|
| 2009/0152645 A1 | 6/2009 | Tran |
| 2009/0170035 A1* | 7/2009 | Lee et al. .................. 430/314 |
| 2009/0209105 A1 | 8/2009 | Yaegashi et al. |
| 2009/0311634 A1 | 12/2009 | Yue et al. |
| 2010/0130016 A1* | 5/2010 | DeVilliers .................. 438/703 |
| 2010/0170871 A1 | 7/2010 | Sone et al. |
| 2010/0291490 A1 | 11/2010 | Tsuruda et al. |
| 2010/0327396 A1* | 12/2010 | Park et al. .................. 257/506 |
| 2011/0070545 A1 | 3/2011 | Dunn et al. |

OTHER PUBLICATIONS

Advances in Resist Materials and Processing Technology XXVI, Proceedings of the SPIE—the International Society for Optical Engineering SPIE, vol. 7273, San Jose, CA, USA, Feb. 23-25, 2009, 12 pp.

Taiwan Intellectual Property Office, Office Action issued in corresponding TW Patent Application No. 100141627, dated Mar. 2, 2014, 14 pp. with English translation.

* cited by examiner

SIDEWALL IMAGE TRANSFER PITCH DOUBLING AND INLINE CRITICAL DIMENSION SLIMMING

CROSS-REFERENCE TO RELATED APPLICATIONS

Pursuant to 37 CFR §1.78(a)(4), this application claims the benefit of and priority to U.S. Provisional Application Ser. No. 61/416,496, filed on Nov. 23, 2010, the entire content of which is herein incorporated by reference.

BACKGROUND OF THE INVENTION

1. Field of Invention

The invention relates to a method for patterning a thin film on a substrate, and more particularly to a method for multiple patterning a thin film on a substrate.

2. Description of Related Art

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

More recently, a double patterning approach has been introduced to allow the patterning of smaller features at a smaller pitch than what is currently possible with standard lithographic techniques. One approach to reduce the feature size is to use standard lithographic pattern and etch techniques on the same substrate twice (i.e., LELE, or Litho/Etch/Litho/Etch), thereby forming larger patterns spaced closely together to achieve a smaller feature size than would be possible by single exposure. During LELE double patterning, the substrate is exposed to a first pattern, the first pattern is developed in the radiation-sensitive material, the first pattern formed in the radiation-sensitive material is transferred to an underlying layer using an etching process, and then this series of steps is repeated for a second pattern.

Another approach to reduce the feature size is to use standard lithographic pattern on the same substrate twice followed by etch techniques (i.e., LLE, or Litho/Litho/Etch), thereby forming larger patterns spaced closely together to achieve a smaller feature size than would be possible by single exposure. During LLE double patterning, the substrate is exposed to a first pattern, the substrate is exposed to a second pattern, the first pattern and the second pattern are developed in the radiation-sensitive material, and the first pattern and the second pattern formed in the radiation-sensitive material are transferred to an underlying layer using an etching process.

One approach to LLE double patterning includes a Litho/Freeze/Litho/Etch (LFLE) technique that utilizes an application of a freeze material on a first pattern in a first patterning layer to cause "freezing" or cross-linking therein, thus allowing the first patterning layer to withstand subsequent processing of a second patterning layer with a second pattern. However, conventional double patterning techniques still have a limit to the ultimate feature size that is printable.

SUMMARY OF THE INVENTION

The invention relates to a method for patterning a thin film on a substrate. The invention also relates to methods for double patterning or quadruple patterning a thin film on a substrate. The invention further relates to a method for patterning a thin film on a substrate using a LFLE double patterning technique and a sidewall image transfer technique. Further yet, the LFLE double patterning technique and sidewall image transfer technique includes a critical dimension (CD) slimming process.

According to one embodiment, a method for patterning a substrate is described. The method may include performing a lithographic process to produce a pattern and a CD slimming process to reduce a CD in the pattern to a reduced CD. Thereafter, the pattern is doubled to produce a double pattern using a sidewall image transfer technique.

According to another embodiment, a method for patterning a substrate is described. The method may include a LFLE technique to produce a first double pattern that includes a first CD slimming process to reduce a first CD to a first reduced CD in the first double pattern and a second CD slimming process to reduce a second CD to a second reduced CD in the first double pattern. Thereafter, the first double pattern is doubled to produce a second double pattern using a sidewall image transfer technique.

According to another embodiment, a method for patterning a substrate is described. The method may include: preparing a pattern in a layer of radiation-sensitive material using a lithographic process, the pattern being characterized by a CD; following the preparing the pattern, performing a CD slimming process to reduce the CD to a reduced CD; conformally depositing a material layer over the pattern with the reduced CD; partially removing the material layer using an etching process to expose a top surface of the pattern, open a portion of the material layer at a bottom region between adjacent features of the pattern, and retain a remaining portion of the material layer on sidewalls of the pattern; and removing the pattern using one or more etching processes to leave a final pattern comprising the remaining portion of the material layer that remained on the sidewalls of the pattern.

According to another embodiment, a method for patterning a substrate is described. The method comprises: forming a first layer of radiation-sensitive material; preparing a first pattern in the first layer of radiation-sensitive material using a first lithographic process, the first pattern being characterized by a first CD; following the preparing the first pattern, performing a first CD slimming process to reduce the first CD to a first reduced CD; freezing the first pattern with the first reduced CD in the first layer of radiation-sensitive material using a freeze process; forming a second layer of radiation-sensitive material on the first pattern with the first reduced CD in the first layer of radiation-sensitive material; preparing a second pattern in the second layer of radiation-sensitive material using a second lithographic process, the second pattern being characterized by a second CD; and following the preparing the second pattern, performing a second CD slimming process to reduce the second CD to a second reduced CD. The method further comprises conformally depositing a material layer over the first pattern with the first reduced CD and the second pattern with the second reduced CD, partially removing the material layer using an etching process to expose a top surface of the first pattern and a top surface of the second pattern, open a portion the material layer at a bottom region between the first pattern and the second pattern, and retain a remaining portion of the material layer on sidewalls of the first pattern and the second pattern; and removing the first pattern and the second pattern using one or more etching processes to leave a third pattern comprising the remaining portion of the material layer that remained on the sidewalls of the first pattern and the second pattern.

According to yet another embodiment, a line pattern formed in one or more layers of radiation-sensitive material comprising a line pattern CD less than 10 nm is described.

DETAILED DESCRIPTION OF SEVERAL EMBODIMENTS

Figure 1A:
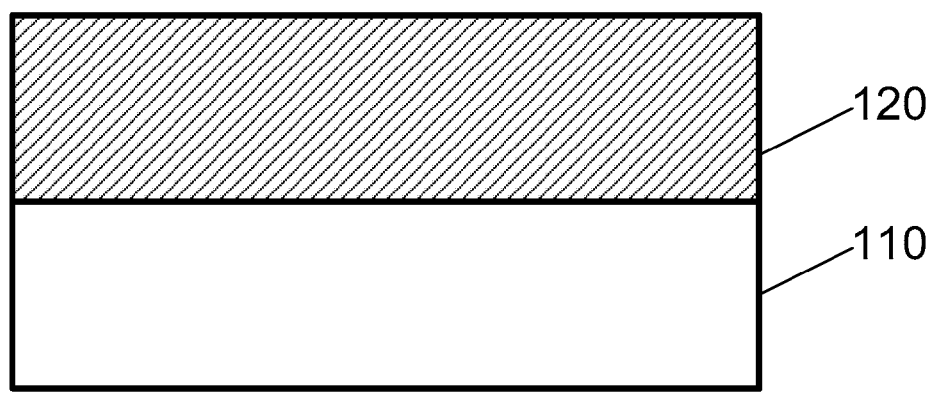
FIGS. 1A through 1J present a simplified schematic representation of a method of patterning a substrate according to an embodiment.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Referring now to the drawings, wherein like reference numerals designate identical or corresponding parts throughout the several views, FIGS. 1A through 1J, and FIG. 2 illustrate a method for patterning a substrate according to an embodiment. The method is illustrated in a flow chart 200, and begins in 210 with preparing a pattern in a layer of radiation-sensitive material using a lithographic process, wherein the pattern is characterized by a critical dimension (CD).

As shown in FIG. 1A, the preparing of the pattern may include forming a first layer of radiation-sensitive material 120 on a substrate 110. The first layer of radiation-sensitive material 120 may include a photo-resist. For example, the first layer of radiation-sensitive material 120 may comprise a 248 nm (nanometer) resist, a 193 nm resist, a 157 nm resist, an EUV (extreme ultraviolet) resist, or an electron beam sensitive resist. Furthermore, for example, the first layer of radiation-sensitive material 120 may comprise a thermal freeze photo-resist, an electromagnetic (EM) radiation freeze photo-resist, or a chemical freeze photo-resist.

The first layer of radiation-sensitive material 120 may be formed by spin-coating the material onto substrate 110. The first layer of radiation-sensitive material 120 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

Figure 1B:
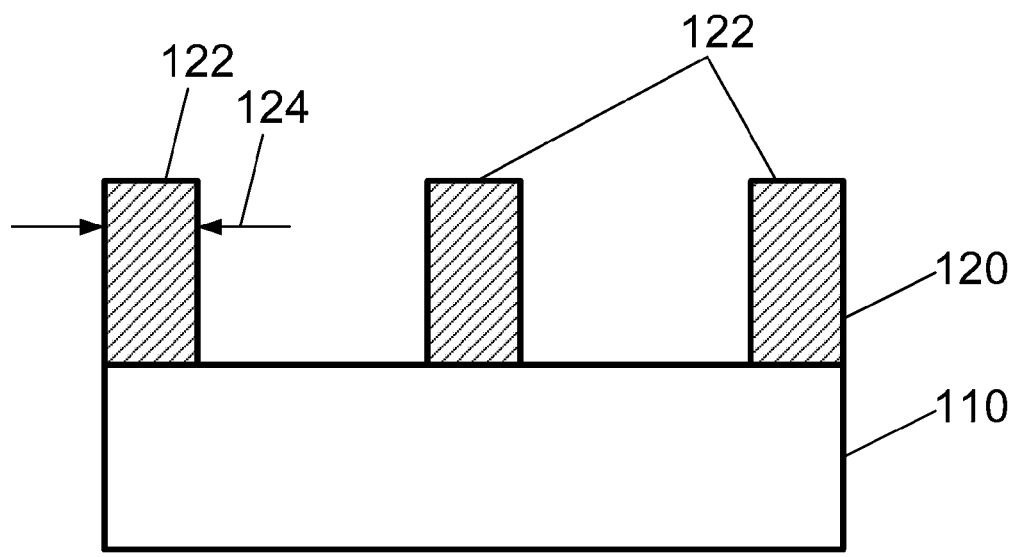

As shown in FIG. 1B, the preparing of the pattern may further include preparing a first pattern 122 in the first layer of radiation-sensitive material 120 using a first lithographic process, wherein the first pattern 122 is characterized by a first critical dimension (CD) 124. The substrate 110 having the first layer of radiation-sensitive material 120 is aligned at a first alignment position in a radiation exposure system and imaged with first radiation having a first image pattern. The radiation exposure system may include a dry or wet photo-lithography system. The first image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the first image pattern may be formed using an electron beam lithography system.

The first layer of radiation-sensitive material 120, having been exposed to the first image pattern, is subjected to a developing process in order to remove the first image pattern region, and form the first pattern 122 in the first layer of radiation-sensitive material 120. The first pattern 122 may be characterized by the first CD 124. The first pattern 122 may include a first line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

Figure 1C:
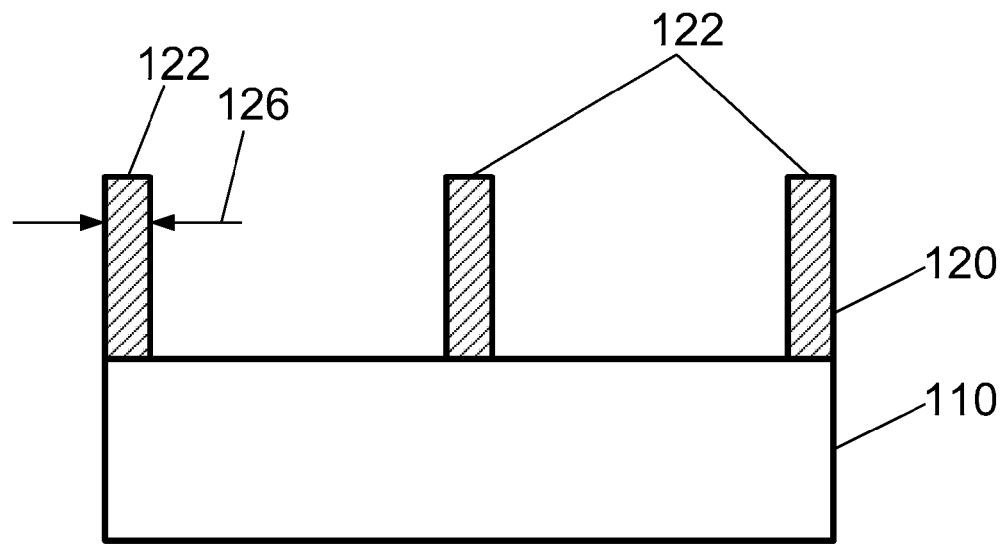
Figure 3:
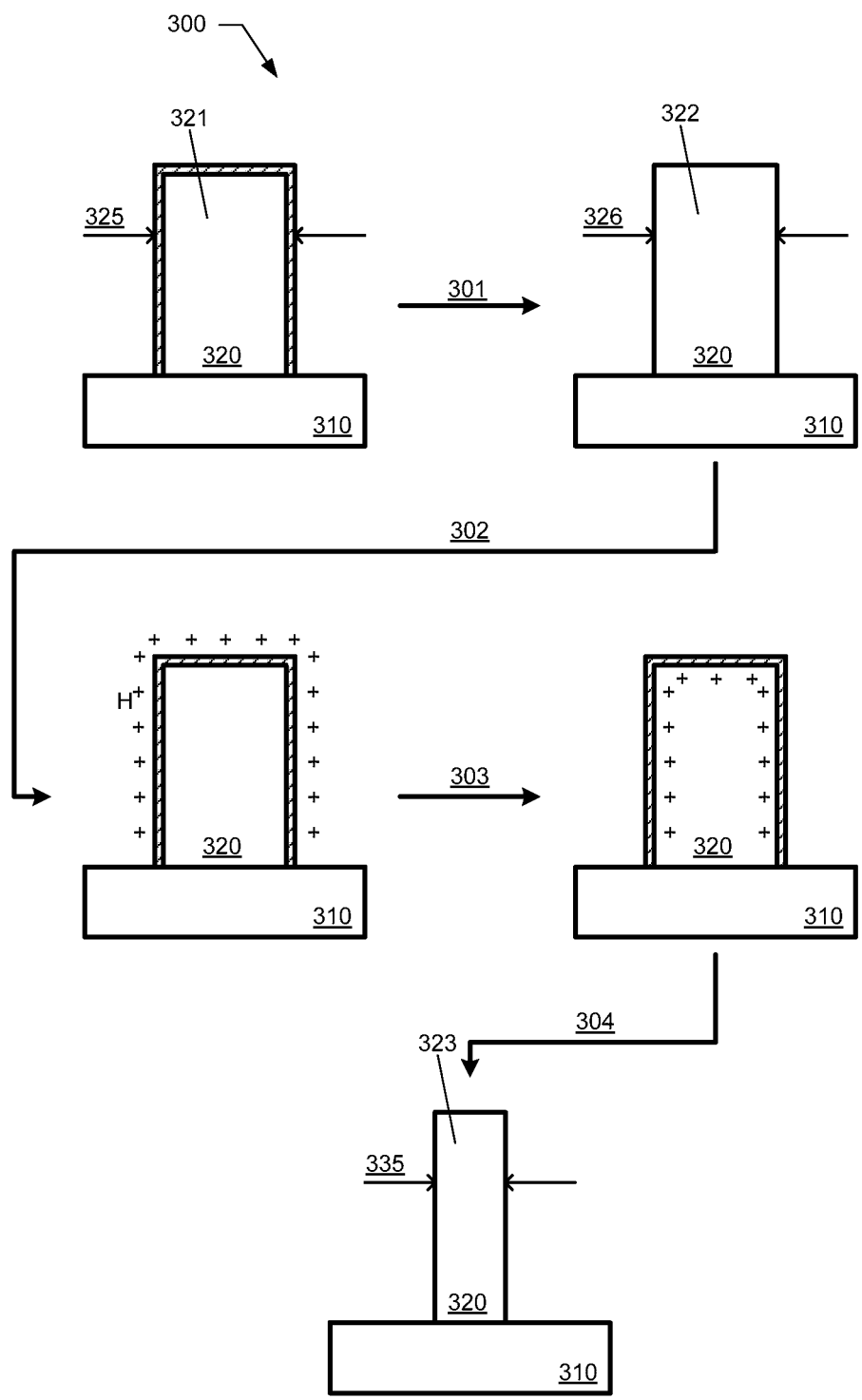
FIG. 3 presents a simplified schematic representation of a method for performing a CD slimming process according to another embodiment.
Figure 4A:
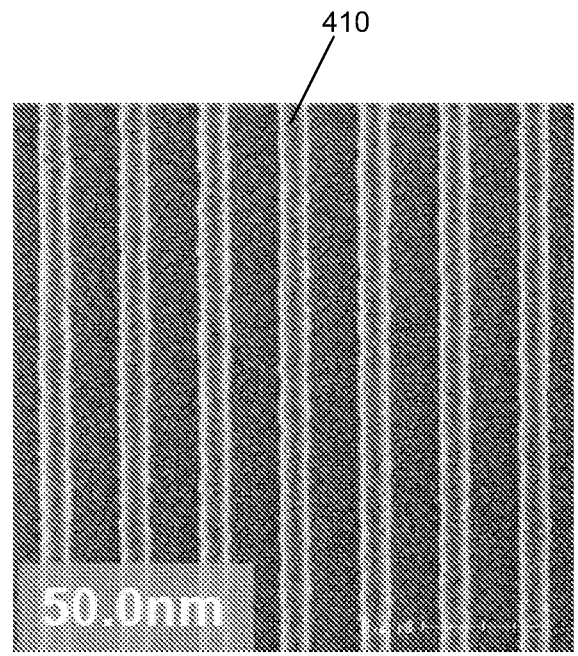
FIGS. 4A and 4B provide exemplary data for performing a CD slimming process.
Figure 4B:
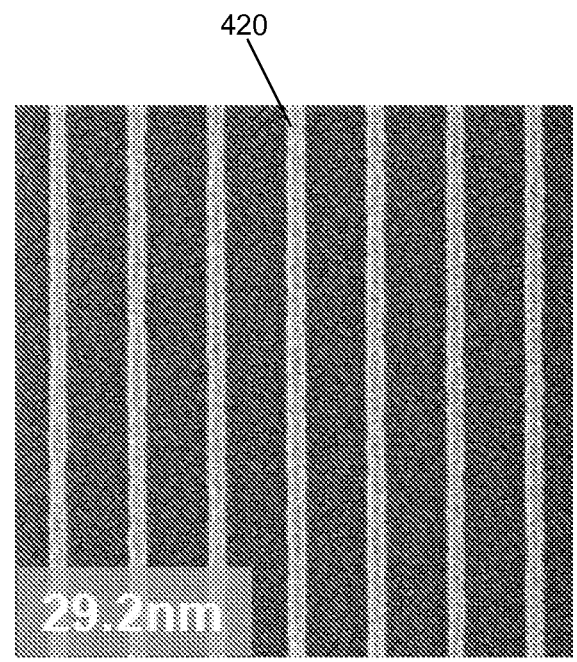

In 220, a CD slimming process is performed, following the preparing the pattern, to reduce the CD to a reduced CD. The performing the CD slimming process may include, as shown in FIG. 1C, performing a first CD slimming process to reduce the first CD 124 to a first reduced CD 126. FIG. 3 illustrates a CD slimming process, and FIGS. 4A and 4B provide exemplary data for the CD slimming process.

Figure 1D:
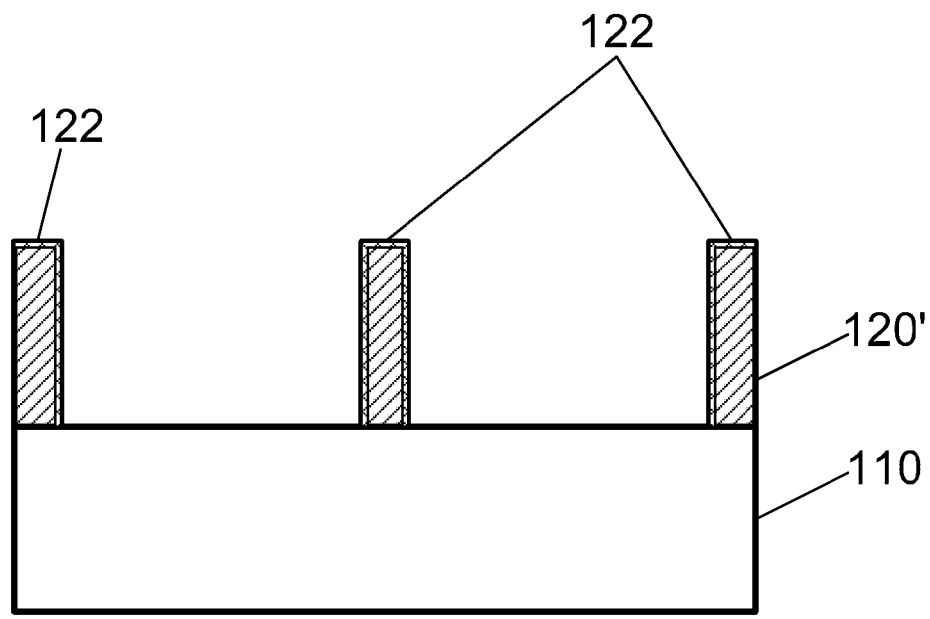

As shown in FIG. 1D, the first pattern 122 with the first reduced CD 126 in the first layer of radiation-sensitive material 120 is frozen using a freeze process to form a frozen first layer of radiation-sensitive material 120'. In one embodiment, the first layer of radiation-sensitive material 120 may include a thermally curable freeze resist, wherein freezing the first pattern 122 in the first layer of radiation-sensitive material 120 using the freeze process comprises baking (or thermally heating) the first layer of radiation sensitive material 120 to thermally cure and preserve the first pattern 122 with the first reduced CD 126. During the freeze process, the temperature and the bake time are process parameters that may be adjusted to achieve pattern CD control.

As will be discussed later and while not intended to be limiting, the terms "freeze", "freezing", "frozen", etc., as used herein, represent a process or a result of the process wherein a layer of radiation-sensitive material is prepared and/or treated to alter a condition of the layer of radiation-sensitive material to withstand subsequent lithographic processing. For example, once a pattern is frozen in the layer of radiation-sensitive material, the pattern substantially remains with or without some change to the pattern CD following an additional lithographic process.

In an alternate embodiment, the first layer of radiation-sensitive material 120 may include an EM radiation curable freeze resist, wherein freezing the first pattern 122 in the first layer of radiation-sensitive material 120 using the freeze process comprises exposing the first layer of radiation sensitive material 120 to EM radiation to radiatively cure and preserve the first pattern 122 with the first reduced CD 126. During the freeze process, the EM intensity and the time for exposure are process parameters that may be adjusted to achieve pattern CD control.

In yet another alternate embodiment, the first layer of radiation-sensitive material 120 may include a chemically curable freeze resist, wherein freezing the first pattern 122 in the first layer of radiation-sensitive material 120 using the freeze process comprises applying a chemical freeze material to and reacting the chemical freeze material with the first layer of radiation sensitive material 120 to chemically cure and preserve the first pattern 122 with the first reduced CD 126. During the freeze process, the concentration and type of the chemical freeze material, and the time for exposure are process parameters that may be adjusted to achieve pattern CD control.

Therein, a chemical freeze material may be applied over the first layer of radiation-sensitive material 120 to chemically interact with the first layer of radiation-sensitive material 120. The chemical freeze material may be formed by spin-coating the material onto substrate 110. The chemical freeze material may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat substrate 110 and cure at least a portion of the chemical freeze material.

As a result of applying the chemical freeze material to substrate 110 and heating substrate 110, a portion of the chemical freeze material reacts with the exposed surface of the first layer of radiation-sensitive material 120 to form the frozen first layer of radiation-sensitive material 120'. Thereafter, the chemical freeze material is stripped from the substrate 110 using a strip solution to preserve the first pattern 122 in the frozen first layer of radiation-sensitive material 120'. The strip solution may contain a conventional strip solution or a high normality strip solution. For example, the strip solution contains an active solute having a normality (N) greater than 0.26. Alternatively, the strip solution contains an active solute having a normality (N) greater than 0.3. Alternatively, the strip solution contains an active solute having a normality (N) greater than 0.4. Alternatively, the strip solution contains an active solute having a normality (N) greater than 0.5.

The strip solution may comprise an aqueous alkali solution. Additionally, the strip solution may contain a hydroxide. Additionally, the strip solution may contain a quaternary ammonium hydroxide. Furthermore, the strip solution may include tetramethyl ammonium hydroxide (TMAH). The normality (N) of TMAH in the strip solution may be equal to or greater than 0.26. Alternatively, the normality (N) of TMAH in the strip solution may be greater than or equal to 0.3. Alternatively, the normality (N) of TMAH in the strip solution may be greater than or equal to 0.4. Alternatively, the normality (N) of TMAH in the strip solution may be greater than or equal to 0.5. Alternatively yet, the normality (N) of TMAH in the strip solution may be about 0.32. The concentration of TMAH in the strip solution may be equal to or greater than 2.36 (Yow/v (or 2.36 grams of solute per 100 milliliters (ml) of solution). Alternatively, the concentration of TMAH in the strip solution may be greater than 2.72 (Yow/v (or 2.72 grams of solute per 100 milliliters (ml) of solution). Conventional strip solutions have a normality (N) of 0.26 or less. For example, TMAH-based strip solutions are readily available from a commercial vendor with a normality of 0.26. The increase of the normality (N) in excess of 0.26 leads to an increase in substrate throughput for the double patterning process and a decrease in substrate defectivity which affects device yield.

In each embodiment, the freeze process creates a protective layer, extending partly or wholly through the first pattern 122, that protects the first pattern 122 in the first layer of radiation-sensitive material 120 from subsequent lithographic processes, such as coating, exposing, developing, and slimming processes, hence, "freezing" the first layer of radiation-sensitive material 120 to form the frozen first layer of radiation-sensitive material 120' characterized by the first reduced CD.

The first layer of radiation-sensitive material, whether it be a thermally curable freeze resist, an EM curable freeze resist, or a chemically curable freeze resist, may include a material that exhibits cross-linking when thermally treated, radiatively treated, or chemically treated. Additionally, the chemical freeze material may include any removable material that may cause cross-linking in a layer of radiation-sensitive material.

The chemical freeze material may include a polymeric material. For example, these materials may include materials commercially available from JSR Micro, Inc. (1280 North Mathilda Avenue, Sunnyvale, Calif. 94089), including, for example, FZX F112 freeze material. Alternatively, for example, these materials may include materials commercially available from Rohm and Haas, a wholly owned subsidiary of Dow Chemical Company (100 Independence Mall West, Philadelphia, Pa. 19106), including, for example, SC™ 1000 Surface Curing Agents (SCA).

Figure 1E:
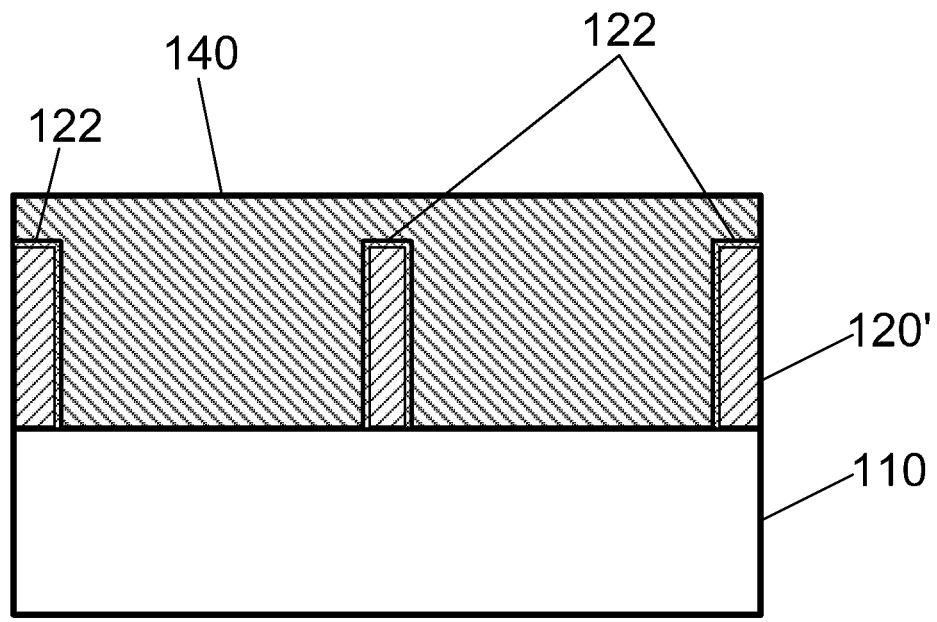

As shown in FIG. 1E, the preparing of the pattern may further include forming a second layer of radiation-sensitive material 140 on substrate 110. The second layer of radiation-sensitive material 140 may include a photo-resist. For example, the second layer of radiation-sensitive material 140 may comprise a 248 nm (nanometer) resist, a 193 nm resist, a 157 nm resist, an EUV (extreme ultraviolet) resists, or an electron beam sensitive resist. The second layer of radiation-sensitive material 140 may be formed by spin-coating the material onto substrate 110. The second layer of radiation-sensitive material 140 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more second PABs to heat the substrate 110 and one or more cooling cycles, following the one or more second PABs, to cool the substrate 110.

Figure 1F:
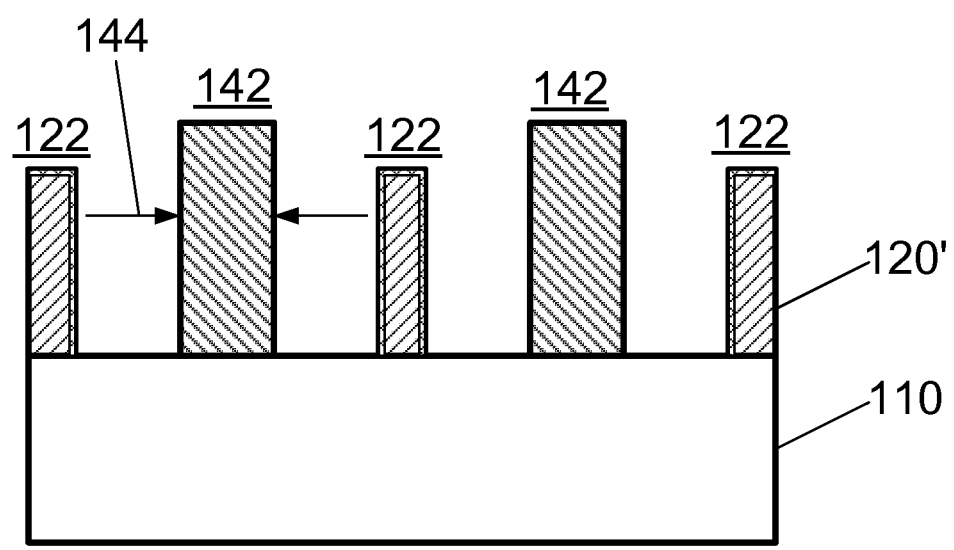

As shown in FIG. 1F, the preparing of the pattern may further include preparing a second pattern 142 in the second layer of radiation-sensitive material 140 using a second lithographic process, wherein the second pattern 142 is characterized by a second CD 144. The substrate 110 having the second layer of radiation-sensitive material 140 is aligned at a second alignment position in a radiation exposure system and imaged with second radiation having a second image pattern. The second radiation may be the same as the first radiation or different than the first radiation. The radiation exposure system may include a dry or wet photo-lithography system. The second image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the second image pattern may be formed using an electron beam lithography system.

The second layer of radiation-sensitive material 140, having been exposed to the second image pattern, is subjected to a developing process in order to remove the second image pattern region, and form a second pattern 142 in the second layer of radiation-sensitive material 140. The second pattern 142 may be characterized by a second critical dimension (CD) 144. The second pattern 142 may include a second line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more second PEBs to heat the substrate 110 and one or more cooling cycles, following the one or more second PEBs, to cool the substrate 110.

Figure 1G:
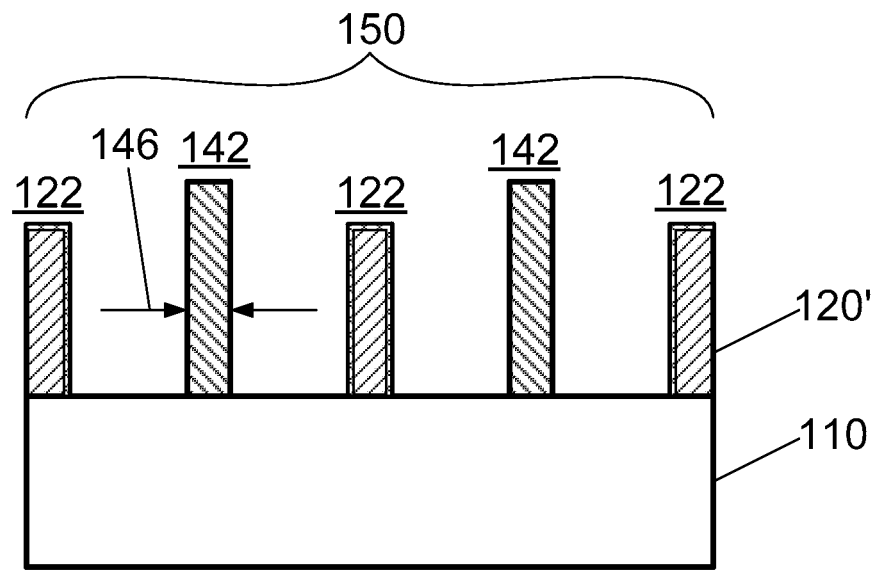

The performing the CD slimming process may further include, as shown in FIG. 1G, performing a second CD slimming process to reduce the second CD 144 to a second reduced CD 146, thus leaving behind a mandrel pattern 150 having the first pattern 122 and the second pattern 142. FIG. 3 illustrates a CD slimming process, and FIGS. 4A and 4B provide exemplary data for the CD slimming process.

Figure 1H:
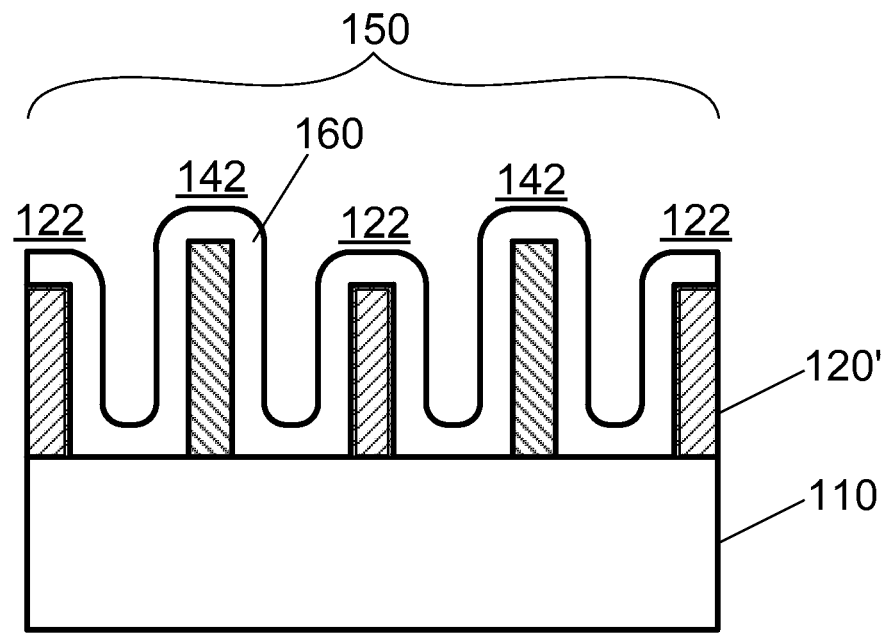

In 230 and as shown in FIG. 1H, a material layer 160 is conformally deposited over the pattern with the reduced CD, wherein the pattern with the reduced CD may include the mandrel 150 including the first pattern 122 with the first reduced CD 126 and the second pattern 142 with the second reduced CD 146. The technique of conformally depositing material layer 160 may include a CVD (chemical vapor deposition) process, a plasma enhanced CVD process, an atomic layer deposition (ALD) process, a plasma enhanced ALD process, or more generally, a monolayer deposition process.

The material layer 160 may include an oxide, a nitride, or an oxynitride. For example, the material layer 160 may include silicon oxide ($SiO_x$), silicon nitride ($SiN_y$), or silicon oxynitride ($SiO_xN_y$). However, the material layer 160 may include other materials.

Figure 1I:
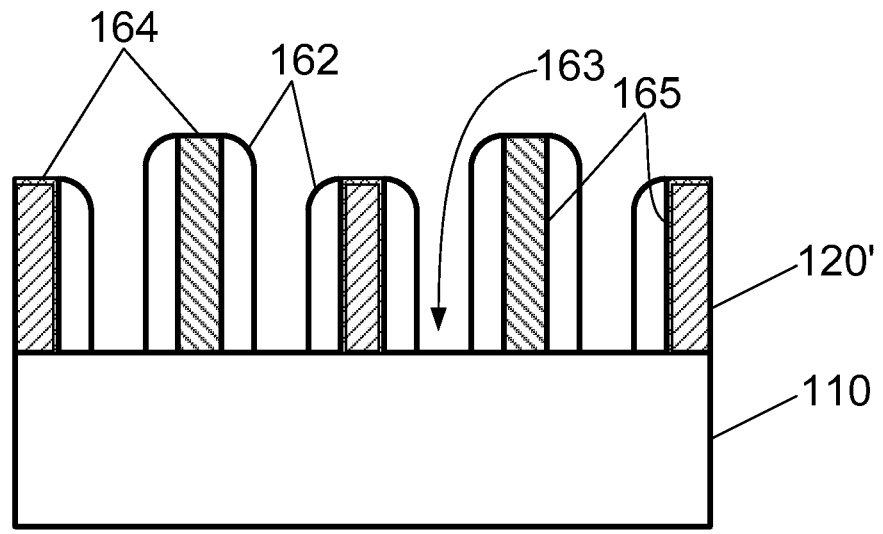

In 240 and as shown in FIG. 1I, the material layer 160 is partially removed using an etching process to expose a top surface 164 of the pattern, such as mandrel pattern 150, and open a portion of the material layer 160 at a bottom region 163 between adjacent features of the pattern. As a result, a remaining portion 162 of the material layer 160 is retained on sidewalls 165 of the pattern. The etching process may include any combination of a wet or dry etching process. The dry etching process may include a dry plasma etching process or a dry non-plasma etching process. In one embodiment, a dry plasma etching process using plasma formed of a process composition containing $C_xF_y$ and/or $C_xF_yH$, is contemplated.

Figure 1J:
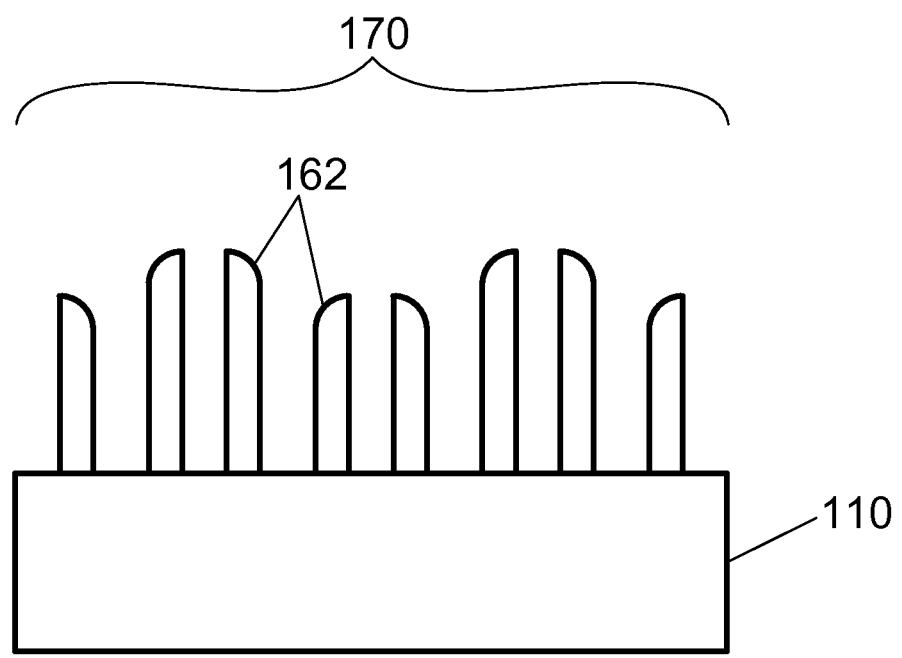
Figure 2:
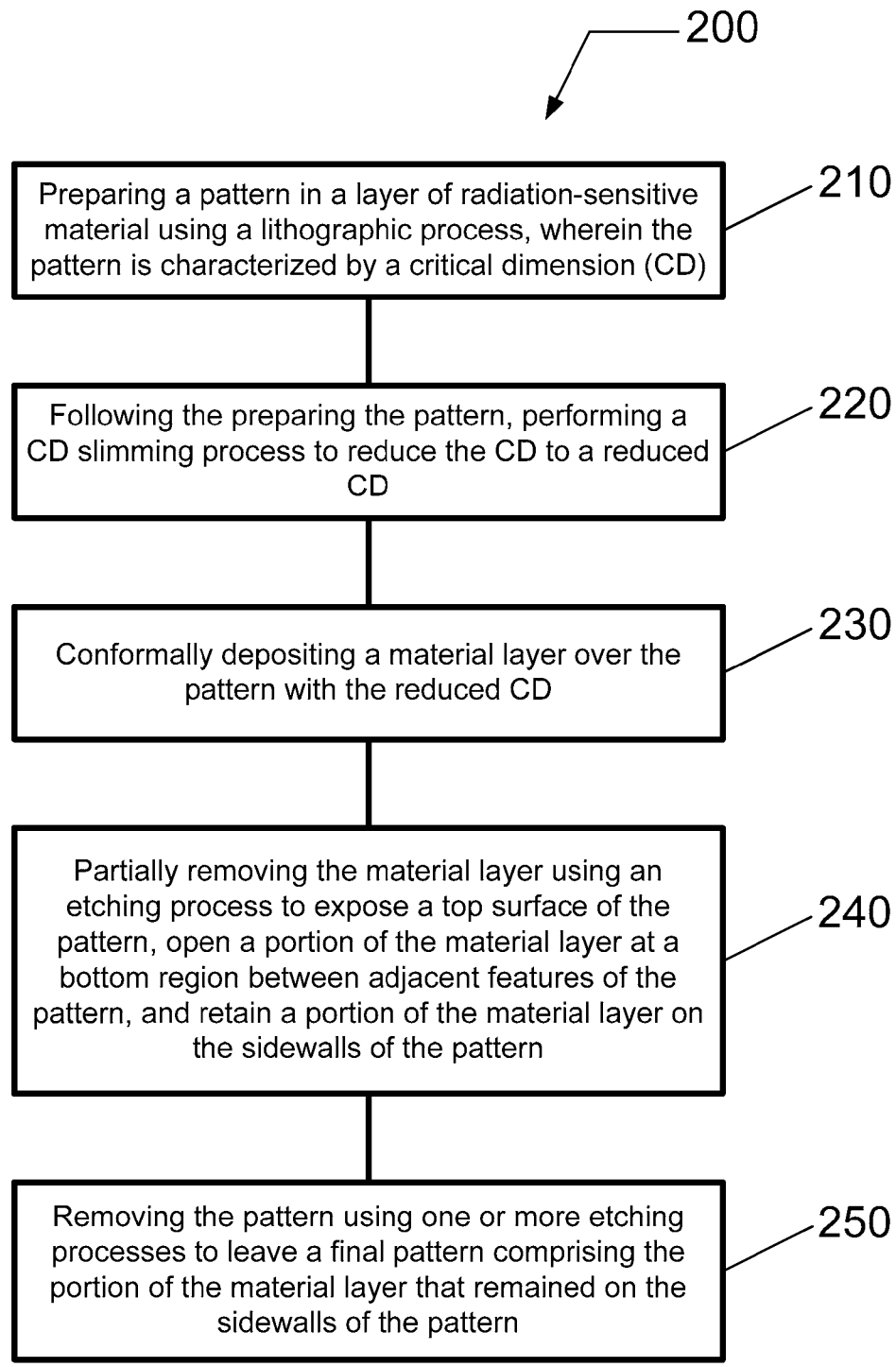
FIG. 2 illustrates a method of patterning a substrate according to another embodiment.

In 250 and as shown in FIG. 1J, the pattern, such as mandrel pattern 150 including the first pattern 122 with the first reduced CD 126 and the second pattern 142 with the second reduced CD 146, is removed using one or more etching processes to leave a final pattern 170 comprising the remaining portion 162 of the material layer 160 that remained on the sidewalls 165 of the pattern. As a result, final pattern 170 may include a quadruple pattern originating from the first and second patterns (122, 142). The one or more etching processes may include any combination of wet or dry etching processes. The dry etching processes may include dry plasma etching processes or dry non-plasma etching processes. In one embodiment, a wet etching process is contemplated. In an alternate embodiment, a dry plasma etching process using plasma formed of a process composition containing oxygen is contemplated.

Thereafter, the final pattern 170, including the remaining portion 162 of the material layer 160, is transferred to an underlying layer of the substrate 110 using one or more etching processes. The one or more etching processes may include any combination of wet or dry etching processes. The dry etching processes may include dry plasma etching processes or dry non-plasma etching processes.

As illustrated pictorially in FIG. 3, the CD slimming process, such as the first CD slimming process and/or the second CD slimming process referred to above, comprises a process sequence 300 beginning with preparing a layer of radiation-sensitive material 320 overlying a substrate 310. As described above, following the exposure of the layer of radiation-sensitive material 320 to electromagnetic (EM) radiation in the photo-lithography system, the layer of radiation-sensitive material 320 is developed by exposing the layer of radiation-sensitive material 320 to a first developing solution, thus, leaving behind a pattern 321 having CD 325. During the exposure of the layer of radiation-sensitive material 320 to EM radiation, a (cross-hatched) portion of the pattern 321 is exposed to EM radiation of intermediate intensity, yet remains following exposure to the first developing solution.

In 301, the layer of radiation-sensitive material 320 is developed further by exposing the layer of radiation-sensitive material 320 to a second developing solution at an elevated temperature. In doing so, the second developing solution at the elevated temperature removes the (cross-hatched) portion of the pattern 321 that is exposed to EM radiation of intermediate intensity leaving behind an intermediate pattern 322 with an intermediate reduced CD 326. As an example, the second developing solution may include a TMAH-containing solution elevated to a hot develop temperature greater than or equal to about 23 degrees C. Alternatively, as an example, the second developing solution may include a TMAH-containing solution elevated to a hot develop temperature greater than or equal to about 25 degrees C. Alternatively, as an example, the second developing solution may include a TMAH-containing solution elevated to a hot develop temperature greater than or equal to about 30 degrees C. Alternatively, as an example, the second developing solution may include a TMAH-containing solution elevated to a hot develop temperature greater than or equal to about 23 degrees C. and less than or equal to about 50 degrees C. Alternatively yet, as an example, the second developing solution may include a TMAH-containing solution elevated to a hot develop temperature greater than or equal to about 30 degrees C. and less than or equal to about 50 degrees C. In this process step, the concentration of the developing solution, the temperature, and the time for exposure are process parameters that may be adjusted to achieve pattern CD control.

In 302, the intermediate pattern 322 with intermediate reduced CD 326 is treated with an acid (represented with "+" signs, and/or $H^+$) solution. As an example, an acid-containing solution may be applied to the layer of radiation-sensitive material 320 with intermediate reduced CD 326 via spin-coating, as described above. In this process step, the concentration of the acid-containing solution, the temperature, and the time for exposure are process parameters that may be adjusted to achieve pattern CD control.

In 303, the layer of radiation-sensitive material 320 is elevated in temperature to diffuse the acid into the pattern in the layer of radiation-sensitive material 320. As an example, the layer of radiation-sensitive material 320 is elevated to a bake temperature greater than or equal to about 50 degrees C. Alternatively, as an example, the layer of radiation-sensitive material 320 is elevated to a bake temperature ranging from about 50 degrees C. to about 180 degrees C. In this process step, the temperature and the time for exposure are process parameters that may be adjusted to achieve pattern CD control.

In 304, the layer of radiation-sensitive material 320 is developed further yet by exposing the layer of radiation-sensitive material 320 to a third developing solution. In doing so, the third developing solution produces a final pattern 323 in the layer of radiation-sensitive material 320 with a reduced CD 335. As an example, the third developing solution may include a TMAH-containing solution at room temperature. In this process step, the concentration of the developing solution, the temperature, and the time for exposure are process parameters that may be adjusted to achieve pattern CD control.

Additional details for a CD slimming process may be found in U.S. Patent Application Publication Serial No. 2010/0291490A1, entitled "Resist Pattern Slimming Treatment Method". Other details for a CD slimming process may be found in U.S. patent application Ser. No. 12/751,362, entitled "Method of Slimming Radiation-Sensitive Material Lines in Lithographic Applications" and filed on Mar. 31, 2010, or U.S. patent application Ser. No. 13/077,833, entitled "Method of Slimming Radiation-Sensitive Material Lines in Lithographic Applications" and filed on Mar. 31, 2011.

As shown in FIGS. 4A and 4B, a CD slimming process is performed to reduce a first line CD 410 of about 50 nm (nanometers) to a second line CD 420 of about 29.2 nm.

At least one process parameter for the first CD slimming process, the second CD slimming process, the freeze process, the first lithographic process, or the second lithographic process, or any combination of two or more thereof may be optimized to prevent collapse of said first pattern and said second pattern. Further, at least one process parameter for the first CD slimming process, the second CD slimming process, the freeze process, the first lithographic process, or the second lithographic process, or any combination of two or more thereof may be optimized to produce the second reduced CD in the second pattern while minimally impacting the first reduced CD in the first pattern that has been subjected to the freeze process.

As an example, the first CD for the first pattern and/or the second CD for the second pattern may be adjusted to achieve optimal printing of the first and second patterns with reduced CD. Alternatively, as an example, the amount of reduction between the first CD and the first reduced CD and/or the amount of reduction between the second CD and the second reduced CD may be adjusted to achieve optimal printing of the first and second patterns with reduced CD.

In one embodiment, the second CD slimming process may be designed to achieve the second reduced CD in the second pattern, while minimally impacting the first reduced CD in the first pattern. For example, the first lithographic process and the second lithographic process may be performed to print a first CD and a second CD that are substantially or approximately equivalent. Thereafter, the first CD slimming process reduces the first CD to the first reduced CD, and the second CD slimming process reduces the second CD to the second reduced CD, while not impacting the first reduced CD, such that the first reduced CD and the second reduced CD are substantially or approximately equivalent.

In an alternate embodiment, the second CD slimming process may be designed to achieve reduction of both the first reduced CD and the second CD. For example, the first lithographic process and the second lithographic process may be performed to achieve a first CD and a second CD, wherein the first CD is printed larger than the second CD. Additionally, for example, the first CD may be printed up to about 5% larger than the second CD. Additionally, for example, the first CD may be printed up to about 10% larger than the second CD. Additionally, for example, the first CD may be printed up to about 15% larger than the second CD. Additionally, for example, the first CD may be printed up to about 25% larger than the second CD. Additionally, for example, the first CD may be printed about 25% to about 50% larger than the second CD. Additionally yet, for example, the first CD may be printed about 50% to about 75% larger than the second CD. Thereafter, the first CD slimming process reduces the first CD to the first reduced CD, and the second CD slimming process reduces the second CD to the second reduced CD, while further reducing the first reduced CD to a third reduced CD, such that the third reduced CD and the second reduced CD are substantially or approximately equivalent.

Figure 5:
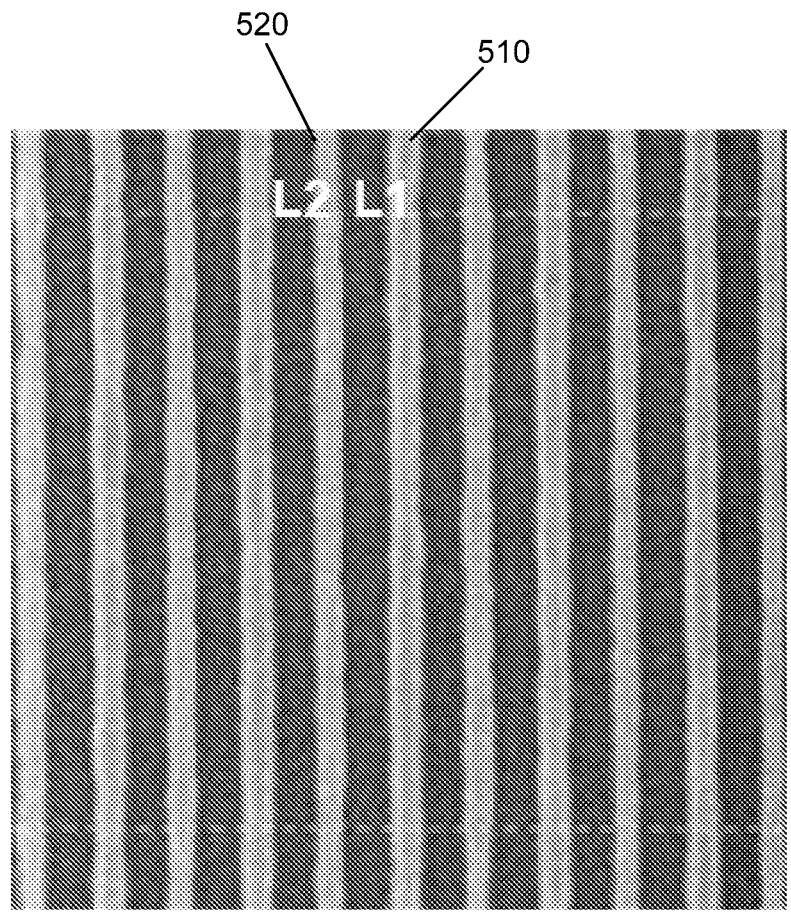
FIG. 5 provides exemplary data for a method of double patterning a substrate.

As shown in FIG. 5, sub-30 nm (nanometer), 1:1 pitch line patterns containing a first line pattern 510 and a second line pattern 520 may be produced. Additionally, sub-25 nm (nanometer), 1:1 pitch line patterns may be produced, and even sub-20 nm (nanometer), 1:1 pitch line patterns may be produced. For example, using a thermally curable freeze resist as the first layer of radiation-sensitive material, the inventors have discovered that sub-20 nm (nanometer), 1:1 pitch line patterns may be produced by printing the first CD larger than the second CD using the first and second lithographic processes, respectively, and optimizing the second CD slimming process. Additionally, for example, using a thermally curable freeze resist as the first layer of radiation-sensitive material, the inventors expect that sub-10 nm (nanometer), 1:1 pitch line patterns may be produced by using a LFLE technique to produce a double pattern, printing the first CD larger than the second CD using the first and second lithographic processes, respectively, optimizing the second CD slimming process, and using the double pattern resulting from the LFLE technique as a mandrel in a sidewall image transfer technique.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for patterning a substrate, comprising:
    preparing a pattern in a layer of radiation-sensitive material using a lithographic process, said lithographic process including developing said pattern with a first developing solution, and said pattern being characterized by a critical dimension (CD);
    following said preparing said pattern, performing a CD slimming process to reduce said CD to a reduced CD, said CD slimming process comprising applying a treatment compound containing an acid onto a surface of said pattern, baking said substrate to diffuse said acid from said surface into a surface region of said pattern to alter a solubility of said surface region of said pattern to a pre-determined depth such that said altered surface region becomes soluble in a second developing solution, and directly thereafter applying said second developing solution to said altered surface region by dispensing said second developing solution on said substrate to remove said surface region of said pattern to said pre-determined depth;
    conformally depositing a material layer over said pattern with said reduced CD;
    partially removing said material layer using an etching process to expose a top surface of said pattern, open a portion of said material layer at a bottom region between adjacent features of said pattern, and retain a remaining portion of said material layer on sidewalls of said pattern; and
    removing said pattern using one or more etching processes to leave a final pattern comprising said remaining portion of said material layer that remained on the sidewalls of said pattern.

2. The method of claim 1, wherein said preparing said pattern comprises:
    forming a first layer of radiation-sensitive material; and
    preparing a first pattern in said first layer of radiation-sensitive material using a first lithographic process, said first pattern being characterized by a first critical dimension (CD).

3. The method of claim 2, wherein said performing said CD slimming process comprises:
    following said preparing said first pattern, performing a first CD slimming process to reduce said first CD to a first reduced CD.

4. The method of claim 3, further comprising repeating one or more times said first CD slimming process, including:
    applying said treatment compound containing an acid onto said surface of said first pattern;
    baking said substrate to diffuse said acid into said first pattern to alter said solubility of said surface region of said first pattern to said pre-determined depth; and
    directly thereafter applying said second developing solution to said altered surface region by dispensing said second developing solution on said substrate to remove said surface region of said first pattern to said pre-determined depth.

5. The method of claim 4, further comprising:
    freezing said first pattern with said first reduced CD in said first layer of radiation-sensitive material using a freeze process.

6. The method of claim 5, wherein said first layer of radiation-sensitive material comprises a thermally curable freeze resist, and wherein said freezing said first pattern in said first layer of radiation-sensitive material using said freeze process comprises baking said first layer of radiation-sensitive material to thermally cure and preserve said first pattern with said first reduced CD.

7. The method of claim 5, wherein said first layer of radiation-sensitive material comprises an electromagnetic (EM) radiation curable freeze resist, and wherein said freezing said first pattern in said first layer of radiation-sensitive material using said freeze process comprises exposing said first layer of radiation-sensitive material to EM radiation to radiatively cure and preserve said first pattern with said first reduced CD.

8. The method of claim 5, wherein said first layer of radiation-sensitive material comprises a chemically curable freeze resist, and wherein said freezing said first pattern in said first layer of radiation-sensitive material using said freeze process comprises:
    applying a chemical freeze material over said first layer of radiation-sensitive material;
    reacting said chemical freeze material with said first layer of radiation-sensitive material to chemically cure and preserve said first pattern with said first reduced CD in said first layer of radiation-sensitive material; and
    stripping said chemical freeze material.

9. The method of claim 5, wherein said preparing said pattern further comprises:
    forming a second layer of radiation-sensitive material on said first pattern with said first reduced CD in said first layer of radiation-sensitive material; and
    preparing a second pattern in said second layer of radiation-sensitive material using a second lithographic process, said second lithographic process including developing said second pattern with said first developing solution, and said second pattern being characterized by a second CD.

10. The method of claim 9, wherein said performing said CD slimming process further comprises:
    following said preparing said second pattern, performing a second CD slimming process to reduce said second CD to a second reduced CD, said second CD slimming process comprising:
    applying said treatment compound containing an acid onto said surface of said second pattern;
    baking said substrate to diffuse said acid into said second pattern to alter said solubility of said surface region of said second pattern to said pre-determined depth; and
    directly thereafter applying said second developing solution to said altered surface region by dispensing said second developing solution on said substrate to remove said surface region of said second pattern to said pre-determined depth.

11. The method of claim 10, further comprising repeating one or more times said second CD slimming process.

12. The method of claim 10, further comprising:
    producing a line pattern pitch for said first pattern and said second pattern that ranges from about 1:1 to about 1:2, wherein said first pattern comprises a first line pattern and said second pattern comprises a second line pattern.

13. The method of claim 10, wherein said first reduced CD is less than about 30 nanometers (nm), and said second reduced CD is less than about 30 nm.

14. The method of claim 10, wherein said first reduced CD is less than about 25 nm, and said second reduced CD is less than about 25 nm.

15. The method of claim 10, further comprising:
optimizing at least one process parameter for said first CD slimming process, said second CD slimming process, said freeze process, said first lithographic process, or said second lithographic process, or any combination of two or more thereof to prevent collapse of said first pattern and said second pattern.

16. The method of claim 10, further comprising:
optimizing at least one process parameter for said first CD slimming process, said second CD slimming process, said freeze process, said first lithographic process, or said second lithographic process, or any combination of two or more thereof to produce said second reduced CD in said second pattern while minimally impacting said first reduced CD in said first pattern that has been subjected to said freeze process.

17. The method of claim 10, further comprising:
preparing said first CD in said first pattern larger than said second CD in said second pattern.

18. The method of claim 10, wherein said first CD is up to about 25% larger than said second CD.

19. The method of claim 1, further comprising:
transferring said pattern to an underlying layer.

20. The method of claim 3, wherein said first CD slimming process comprises, prior to said applying said treatment compound, dispensing a hot developing solution on said substrate, said hot developing solution heated to a hot develop temperature exceeding 30 degrees C.

21. The method of claim 10, wherein said second CD slimming process comprises, prior to said applying said treatment compound, dispensing a hot developing solution on said substrate, said hot developing solution heated to a hot develop temperature exceeding 30 degrees C.

22. A method for patterning a substrate, comprising:
preparing a first pattern in a layer of radiation-sensitive material using a lithographic process, said lithographic process including developing said first pattern with a first developing solution, and said first pattern being characterized by a first critical dimension (CD);
following said preparing said first pattern, performing a first CD slimming process to reduce said first CD to a reduced first CD, said first CD slimming process comprising applying a first treatment compound containing an acid onto a surface of said first pattern, baking said substrate to diffuse said acid from said surface of said first pattern into said surface region of said first pattern to a first pre-determined depth, and directly thereafter dispensing a second developing solution on said substrate to remove said surface region of said first pattern to said first pre-determined depth;
freezing said first pattern with said first reduced CD using a freeze process;
forming a second layer of radiation-sensitive material on said frozen first pattern;
preparing a second pattern in said second layer of radiation-sensitive material using a second lithographic process, said second lithographic process including developing said second pattern with a third developing solution, and said second pattern being characterized by a second CD;
following said preparing said second pattern, performing a second CD slimming process to reduce said second CD to a second reduced CD, said second CD slimming process comprising applying a second treatment compound containing an acid onto a surface of said second pattern, baking said substrate to diffuse said acid from said surface of said second pattern into said surface region of said second pattern to alter said surface region of said second pattern to a second pre-determined depth, and directly thereafter dispensing a fourth developing solution on said substrate to remove said surface region of said second pattern to said second pre-determined depth;
conformally depositing a material layer over said first and second patterns with said reduced first and second CDs, respectively;
partially removing said material layer using an etching process to expose a top surface of each of said first and second patterns, open a portion of said material layer at a bottom region between adjacent features of said first and second patterns, and retain a remaining portion of said material layer on sidewalls of said first and second patterns; and
removing said first and second patterns using one or more etching processes to leave a final pattern comprising said remaining portion of said material layer that remained on the sidewalls of said first and second patterns.

23. The method of claim 22, wherein said first or second CD slimming process, or both, comprises, prior to said applying said treatment compound, dispensing a hot developing solution on said substrate, said hot developing solution heated to a hot develop temperature exceeding 30 degrees C.

\* \* \* \* \*

UNITED STATES PATENT AND TRADEMARK OFFICE
CERTIFICATE OF CORRECTION

| | | |
|---|---|---|
| PATENT NO. | : 8,764,999 B2 | Page 1 of 1 |
| APPLICATION NO. | : 13/158899 | |
| DATED | : July 1, 2014 | |
| INVENTOR(S) | : Shannon W. Dunn et al. | |

It is certified that error appears in the above-identified patent and that said Letters Patent is hereby corrected as shown below:

In the Specification

In Col. 6, line 42, "2.36 (Yow/v" should read --2.36 %w/v--.

In Col. 6, lines 44-45, "2.72 (Yow/v" should read --2.72 %w/v--.

Signed and Sealed this
Seventh Day of October, 2014

Michelle K. Lee
*Deputy Director of the United States Patent and Trademark Office*